US 008440774B2

(12) United States Patent
Lin et al.

(10) Patent No.: US 8,440,774 B2
(45) Date of Patent: May 14, 2013

(54) TRANSPARENT SILICONE EPOXY COMPOSITION

(75) Inventors: Chich-Haw Lin, Taoyuan County (TW); Shu-Chen Huang, Keelung (TW); Hsun-Tien Li, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/078,011

(22) Filed: Apr. 1, 2011

(65) Prior Publication Data

US 2012/0172505 A1 Jul. 5, 2012

(30) Foreign Application Priority Data

Dec. 29, 2010 (TW) ................................ 99146622 A

(51) Int. Cl.
  *C08G 77/08* (2006.01)
(52) U.S. Cl.
  USPC .................. 528/16; 528/21; 528/23; 525/476
(58) Field of Classification Search .................... 528/16, 528/21, 23; 525/476
  See application file for complete search history.

(56) References Cited

U.S. PATENT DOCUMENTS

| 6,756,077 | B2 * | 6/2004 | Yu ................................ 427/387 |
| 6,916,889 | B2 | 7/2005 | Rubinsztajn et al. |
| 7,276,562 | B2 | 10/2007 | Kashiwagi et al. |
| 7,985,807 | B2 * | 7/2011 | Katayama .................... 525/476 |
| 2005/0272896 | A1 | 12/2005 | Kaji et al. |
| 2007/0142574 | A1 | 6/2007 | Kodama |
| 2007/0213492 | A1 * | 9/2007 | Mowrer et al. ................. 528/17 |
| 2009/0091045 | A1 | 4/2009 | Tanikawa et al. |

OTHER PUBLICATIONS

Hayase et al., "Polymerization of Cyclohexene Oxide with Al(acac)3-Silanol Catalyst", Journal of Polymer Science: Polymer Chemistry Edition, 1981, 2185-2194, vol. 19.
Hayase et al., "Polymerization of Cyclohexene Oxide with Aluminum Complex/Silanol Catalysts. V. A Catalytic Activity Dependence on the Aluminum Chelate Structure", Journal of Polymer Science: Polymer Chemistry Edition, 1982, 3155-3165, V20.
Dworak et al., "Synthesis of Cycloaliphatic Substituted Silane Monomers and Polysiloxanes for Photocuring", Macromolecules, 2004, 9402-9417, V37.
Huang et al., "Studies on UV-Stable Silicone-Epoxy Resins", Journal of Applied Polymer Science, 2007, 3954-3959, V104.

* cited by examiner

*Primary Examiner* — Margaret Moore
(74) *Attorney, Agent, or Firm* — Jianq Chyun IP Office

(57) ABSTRACT

A transparent silicone epoxy composition is provided. The transparent silicone epoxy composition comprises (a) at least an epoxy modified siloxane, (b) at least a silanol-containing siloxane and (c) a catalyst. Each epoxy modified siloxane molecule comprises at least two cycloaliphatic epoxy groups and epoxy modified siloxane in the transparent silicone epoxy composition is about 10~89 weight percentage. Silanol-containing siloxane can be cross-linked with epoxy modified siloxane. Silanol-containing siloxane comprises at least two hydroxyl groups. Silanol-containing siloxane in the transparent silicone epoxy composition is about 89~10 weight percentage. The catalyst in the transparent silicone epoxy composition is about 0.01~1 weight percentage.

9 Claims, 1 Drawing Sheet

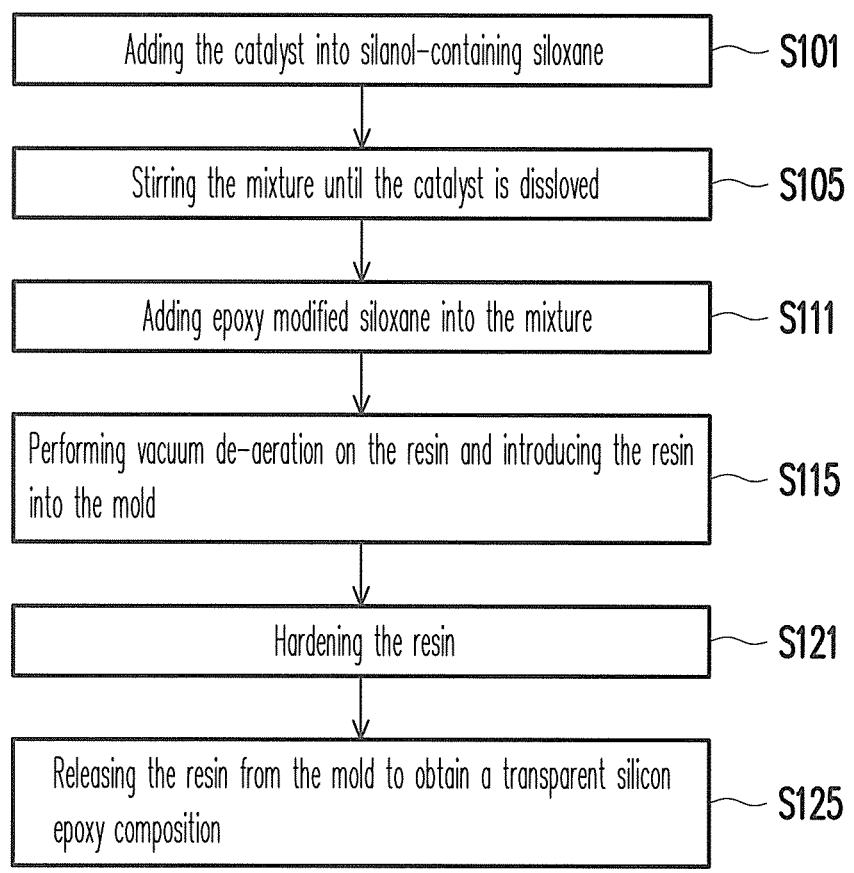

TRANSPARENT SILICONE EPOXY COMPOSITION

CROSS-REFERENCE TO RELATED APPLICATION

This application claims the priority benefit of Taiwan application serial no. 99146622, filed Dec. 29, 2010. The entirety of the above-mentioned patent application is hereby incorporated by reference herein and made a part of this specification.

BACKGROUND OF THE APPLICATION

1. Field of Application

The application relates to a silicone epoxy, and more particularly to a transparent silicone epoxy composition applied on a light emitting diode package.

2. Description of Related Art

The light emitting diode (LED) has the advantages of power saving, small volume, long life-time (hundred-thousand hours), fast response, low pollution, high reliability and large module flexibility so that LEDs are widely applied in the technical fields. Currently, with the progressive technology development, the efficiency and the brightness of the LEDs are continuously enhanced so that the application range is enlarged to cover the backlight module of the display and the light source of the vehicles. In the near further, it is possible for the LEDs to replace the fluorescent lamp to be the next-generation light source. Further, the LEDs with the high power and high brightness become the main stream of the future development and the demands on them gradually increase.

However, under the high operation temperature of the high power operation of the LEDs, the efficiency of the LEDs decreases due to the thermal-yellowing phenomenon of the transparent molding compound of the LEDs. Moreover, both of UV LED and blue-ray LED generate high-energy radiations with short wavelengths and these radiations with short wavelengths leads to the photo-yellowing phenomenon of the transparent molding compound of the LEDs. Furthermore, as for the LEDs applied on the outdoor devices, such as the streetlamps or the headlights of the vehicles, not only the sunlight leads to the yellowing phenomenon of the transparent molding compound of the LEDs, but also the gas, such as oxygen, in the open environment damages the molding compound and the internal elements enclosed by the molding compound. Thus, the life-time of the elements is affected.

Conventionally, the transparent molding compound for the LED packages are the composition of epoxy resin and anhydride. The epoxy resin-anhydride composition has the advantages of good mechanical property, good adherence and low cost. However, anhydride is sensitive to the moisture and is easily converted to the organic acid while being moisturized. Thus, the reactivity of anhydride varies, which leads to degradation of the physical nature of the composition. Meanwhile, the chemical bonding energy of epoxy resin to anhydride is relatively low so that the yellowing phenomenon easily happens under high temperature operation for a long time, which leads to decreasing of the transparency of the molding compound. That is, the yellowing phenomenon of the epoxy resin-anhydride composition easily happens due to the high temperature or the UV radiation which limit the applications of the epoxy resin-anhydride composition on the high power LED packages. Moreover, the silicone resins has the advantages of good photo durability and good heat durability, so that the silicone resins are mainly applied on the high power LED packages. However, the silicone resins has the disadvantages of poor mechanical property, tacky surface which easily leads to the adsorption of particles in the atmosphere. Therefore, the transparency and the light-extraction efficiency of the silicone resin decrease. Further, poor adherence and poor air-barrier ability of the molding compound easily lead to erosion of the metal wires of the elements. Also, under the conditions of high temperature and high humidity, the molding compound is easily atomized which leads to the risk of the reliability in long-time usage.

SUMMARY OF THE APPLICATION

The application provides a transparent silicone epoxy composition having advantages of high photothermal stability, heat durability, high adherence, high temperature-moisture stability and high air-barrier ability.

The application provides a transparent silicone epoxy composition comprises (a) at least an epoxy modified siloxane, (b) at least a silanol-containing siloxane and (c) a catalyst. The formula (1) of epoxy modified siloxane is shown as following:

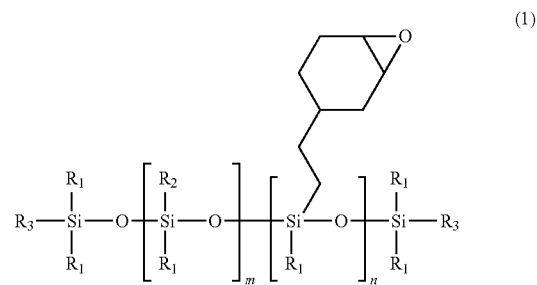

(1)

Wherein n is larger than or equal to two, m/n is about 1~12, $R_1$ is non-substituted $C_1$~$C_3$ alkyl, $R_2$ is non-substituted $C_1$~$C_3$ alkyl or phenyl and $R_3$ is non-substituted $C_1$~$C_3$ alkyl or epoxide. Furthermore, each molecule of epoxy modified siloxane at least comprises two cycloaliphatic epoxide groups and the number average molecular weight of epoxy modified siloxane is about 1000~15000. Moreover, the weight percentage of epoxy modified siloxane in the transparent silicone epoxy composition is about 10~89 wt %. A cross-linking reaction of silanol-containing siloxane with (a) initiates and formula (2) of silanol-containing siloxane is shown as following:

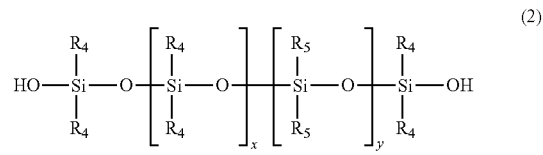

(2)

Wherein $5 \leq x \leq 40$, $0 \leq y \leq 5$, $R_4$ is non-substituted $C_1$~$C_3$ alkyl, $R_5$ is phenyl, and the number average molecular weight of silanol-containing siloxane is about 500~4000. Furthermore, silanol-containing siloxane comprises at least two hydroxyl groups and the weight percentage of silanol-containing siloxane in the transparent silicone epoxy composition is about 89~10 wt %. The weight percentage of the catalyst in the transparent silicone epoxy composition is about 0.01~1 wt %.

It is to be understood that both the foregoing general description and the following detailed description are exemplary, and are intended to provide further explanation of the application as claimed.

BRIEF DESCRIPTION OF THE DRAWINGS

The accompanying drawings are included to provide a further understanding of the application, and are incorporated in and constitute a part of this specification. The drawings illustrate embodiments of the application and, together with the description, serve to explain the principles of the application.

FIG. 1 is a schematic diagram showing a method for forming a transparent silicone epoxy composition according to one embodiment of the present invention.

DESCRIPTION OF THE PREFERRED EMBODIMENTS

The transparent silicone epoxy composition of the present application comprises at least an epoxy modified siloxane, at least a silanol-containing siloxane and a catalyst.

One epoxy modified siloxane molecule at least comprises two cycloaliphatic epoxide groups and the weight percentage of epoxy modified siloxane in the transparent silicone epoxy composition is about 10~89 wt %. In another embodiment, the weight percentage of epoxy modified siloxane in the transparent silicone epoxy composition is about 15~85 wt %. The formula (1) of epoxy modified siloxane is shown as following:

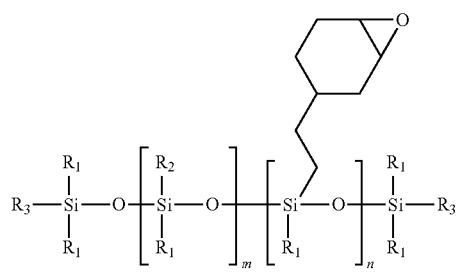

(1)

Wherein n is larger than or equal to two, m/n is about 1~12, $R_1$ is non-substituted $C_1$~$C_3$ alkyl, $R_2$ is non-substituted $C_1$~$C_3$ alkyl or phenyl and $R_3$ is non-substituted $C_1$~$C_3$ alkyl or epoxide. Preferably, $R_1$ is methyl, $R_2$ is methyl or phenyl and $R_3$ is methyl or epoxide. Furthermore, the number average molecular weight of epoxy modified siloxane is about 1000~15000. In another embodiment, n is about 3~10 and m/n is about 2~10.

Furthermore, silanol-containing siloxane comprises at least two hydroxyl groups and the weight percentage of silanol-containing siloxane in the transparent silicone epoxy composition is about 89~10 wt %. In another embodiment, the weight percentage of silanol-containing siloxane in the transparent silicone epoxy composition is about 85~15 wt %. The formula (2) of silanol-containing siloxane is shown as following:

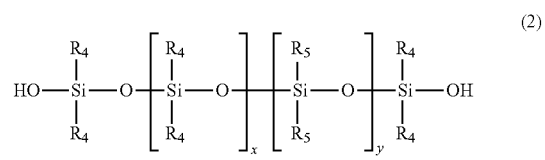

(2)

Wherein $5 \leq x \leq 40$, $0 \leq y \leq 5$, $R_4$ is non-substituted $C_1$~$C_3$ alkyl and $R_5$ is phenyl. Preferably, $R_4$ is methyl. Moreover, the number average molecular weight of silanol-containing siloxane is about 500~4000. In another embodiment, $7 \leq x \leq 35$ and $0 \leq y \leq 3$.

The weight percentage of the catalyst in the transparent silicone epoxy composition is about 0.01~1 wt %. In another embodiment, the weight percentage of the catalyst in the transparent silicone epoxy composition is about 0.01~0.5 wt %. The catalyst includes, for example, aluminum complex compound, such as aluminum acetylacetonate, aluminum tris (propylacetonate), quaternary phosphonium bromide promoter or quaternary ammonium salt promoter.

Moreover, in another embodiment, the transparent silicone epoxy composition of the present application further comprises an additive. The additive includes an anti-thermal oxidation agent, an ultraviolet absorbent (such as 2-hydroxy-4-methoxy-benzophenone) or an adhesion promoter aid (such as 2-(3,4-epoxycyclohexyl)-ethyltrimethoxysilane). Moreover, the weight percentage of the additive in the whole transparent silicone epoxy composition is about 0.01~1 wt %. In one embodiment, the weight percentage of the additive in the whole transparent silicone epoxy composition is about 0.05~0.8 wt %. The aforementioned anti-thermal oxidation agent includes hindered phenolic compounds (such as Octadecyl-3-(3,5-di-tert-butyl-4-hydroxyphenyl)-propionate) or organophosphite compounds (such as Tris(nonylphenyl) phosphate).

In the transparent silicone epoxy composition of the present application, a cross-linking reaction of epoxy modified siloxane with silanol-containing siloxane is performed. Under the existence of the catalyst, the cross-linking reaction (3) is shown as following:

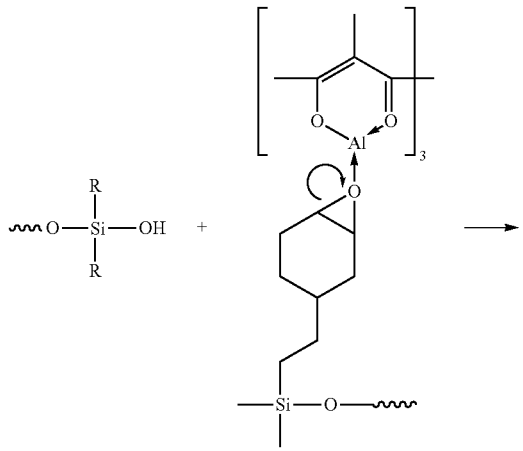

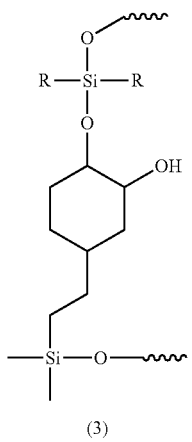

(3)

Wherein the equivalent proportion of epoxy modified siloxane to silanol-containing siloxane is about 0.6/1~1/0.6. Preferably, the equivalent proportion of epoxy modified siloxane to silanol-containing siloxane is about 0.8/1~1/0.8.

The process for forming the transparent silicone epoxy composition is detailed in the following and several embodiment of the transparent silicone epoxy composition of the present application are also described hereafter. Further, the components used in the embodiments for synthetizing the transparent silicone epoxy composition include epoxy modified siloxane, silanol-containing siloxane, catalyst and additive, and are shown in Table 1, Table 2, Table 3 and Table 4 respectively. However, the present application are not limited to the lists shown in table 1, table 2, table 3 and table 4.

TABLE 1

| Item Name | Molecular Weight | Provider |
|---|---|---|
| SEP-151 | Mw = 2400~2600 | lab-synthesized |
| SEP-301 | Mw = 2800~2900 | lab-synthesized |
| SEP-500 | Mw = 1000~1200 | lab-synthesized |
| ECMS-924 | Mw = 10000~12000 | Gelest |

Wherein, epoxy modified siloxane, ELMS-924, provided by Cielest, Inc. is (epoxycyclohexylethyl)-methylsiloxane-dimethylsiloxane copolymer.

TABLE 2

| Item Name | Molecular Weight | Provider |
|---|---|---|
| DMS-S12 | Mw = 400~700 | Gelest |
| DMS-S15 | Mw = 2000~3500 | Gelest |
| PDS-1615 | Mw = 900~1000 | Gelest |

Wherein, silanol-containing siloxane, DMS-S12 and DMS-S15, provided by Geles, Inc. are silanol terminated-poly(dimethylsiloxane). Further, silanol-containing siloxane, PDS-1615, provided by Geles, Inc. is silanol terminated (14-18% diphenylsiloxane)-dimethylsiloxane copolymer.

TABLE 3

| Item Name | Molecular Weight | Provider |
|---|---|---|
| Aluminun-Acetylacetonate | Mw = 324.31 | Sigma Aldrich |
| U-CAT 5003 | | San-Apro |

Wherein, catalyst, Aluminun-Acetylacetonate, is provided by Sigma Aldrich Corp. Further, U-CAT 5003 provided by San-Apro Ltd. is quaternary phosphonium bromide.

TABLE 4

| Item Name | Molecular Weight | Provider |
|---|---|---|
| TP-10H | | Double Bond Chemical |
| KBM-303 | Mw = 246.4 | Shin-Etsu |

Wherein, additive, TP-10H, provided by Double Bond Chemical Ind., Co., Ltd. is organic phosphite and hindered phenolic antioxidant compound. Further, additive, KBM-303, provided by Shin-Etsu Co. is 2-(3,4epoxycyclohexyl)-ethylmethoxysilane.

The synthesizing processes of the aforementioned lab-synthesized epoxy modified siloxane including SEP-151 and SEP-301 are described hereafter.

Synthesis of Epoxy Modified Siloxane SEP-151

4-vinyl-1-cyclohexene-1,2-epoxide (14.92 g), tris(dibutyl-sulfide)rhodium trichloride (20 ppm) and n, n-dioctadecylm-ethylamine (0.003 g) are placed in a 250 ml-two-neck flask. Then, toluene (100 ml) is added into the two-neck flask and the mixture is stirred and heated up to 100° C.

Thereafter, the compound (39 g), HMS-151 ((15-18% methylhydrosiloxane)-dimethylsiloxane copolymer), provided by Geles, Inc. is dropped into the two-neck flask at 100° C. After HMS-151 is dropped into the two-neck flask, the mixture is stirred and heated up to 115° C. to be completely reacted. Then, the mixture is cooled to the room temperature. The activated charcoal is added into the two-neck flask and the mixture is stirred to be purified. The activated charcoal is filtered out and toluene in the filtrate is removed by rotary concentration so that product SEP-151 (50 g) is obtained.

The obtained product SEP-151 is analyzed by FT-IR and the analyzing result shows that the absorption peak of Si—H disappears at 2160 cm$^{-1}$, the absorption peak of C═C representing 4-vinyl-1-cyclohexene-1,2-epoxide disappears at 1638 cm$^{-1}$ and the absorption peak of epoxide group appears at 810 cm$^{-1}$.

Synthesis of Epoxy Modified Siloxane SEP-301

4-vinyl-1-cyclohexene-1,2-epoxide (9.93 g), tris(dibutyl-sulfide)rhodium trichloride (10 ppm) and n, n-dioctadecylm-ethylamine (0.0015 g) are placed in a 250 ml-two-neck flask. Then, toluene (50 ml) is added into the two-neck flask and the mixture is stirred and heated up to 100° C.

Thereafter, the compound (19.5 g), HMS-301 ((25-30% methylhydrosiloxane)-dimethylsiloxane copolymer), provided by Geles, Inc. is dropped into the two-neck flask at 100° C. After HMS-301 is dropped into the two-neck flask, the mixture is stirred and heated up to 115° C. to be completely reacted. Then, the mixture is cooled to the room temperature. The activated charcoal is added into the two-neck flask and the mixture is stirred to be purified. The activated charcoal is filtered out and toluene in the filtrate is removed by rotary concentration so that product SEP-301 (20 g) is obtained.

The obtained product SEP-301 is analyzed by FT-IR and the analyzing result shows that the absorption peak of Si—H disappears at 2160 cm$^{-1}$, the absorption peak of C═C representing 4-vinyl-1-cyclohexene-1,2-epoxide disappears at 1638 cm$^{-1}$ and the absorption peak of epoxide group appears at 810 cm$^{-1}$.

FIG. 1 is a schematic diagram showing a method for forming a transparent silicone epoxy composition according to one embodiment of the present invention. As shown in FIG. 1, in step S101, catalyst is added into silanol-containing siloxane. Then, in the step S105, the mixture is stirred until the catalyst is dissolved. The time for stirring the mixture until the catalyst is dissolved is about 20 minutes. Thereafter, in the step S111, epoxy modified siloxane is added into the mixture and the mixture is stirred so that resin is produced. For instance, the time for stirring the mixture to produce the resin is about 20 minutes.

In the step S115, the produced resin is treated by vacuum de-aeration and then introduced into a mold. The vacuum de-aeration is performed on the resin for about 30 minutes. In the step S121, the resin is hardened. The method for hardening the resin includes, for example, baking the molded resin in an oven at 120° C. for an hour and then baking the molded resin at 150° C. for two hours. In another embodiment, the method for hardening the molded resin includes, for example, baking the molded resin in an oven at 100° C. for an hour and then baking the molded resin at 120° C. for two hours. In the step S125, the hardened resin is released from the mold so that a transparent silicone epoxy composition is obtained.

Several embodiments of transparent silicone epoxy compositions of the present application are detailed hereafter.

Embodiment 1

| Components | Weight Percentage |
| --- | --- |
| ECMS-924 | 76.85 wt % |
| DMS-S12 | 23.05 wt % |
| Aluminun-Acetylacetonate | 0.1 wt % |

The catalyst, aluminum-acetylacetonate, is added into silanol-containing siloxane, DMS-S12, in the flask and then the mixture is stirred at the room temperature for about 20 minutes until the catalyst is dissolved. Then, epoxy modified siloxane, ECMS-924, is added into the mixture in the flask and the mixture is stirred for about 20 minutes to produce resin. The produced resin is treated by vacuum de-aeration for about 30 minutes. Then, the resin is introduced into a mold and baked to be hardened in an oven at 120° C. for an hour and then at 150° C. for two hours. The hardened resin is released from the mold so that a transparent silicone epoxy composition of embodiment 1 is obtained.

Embodiment 2

| Components | Weight Percentage |
| --- | --- |
| ECMS-924 | 74.35 wt % |
| PDS-1615 | 7.71 wt % |
| DMS-S12 | 17.84 wt % |
| Aluminun-Acetylacetonate | 0.1 wt % |

The catalyst, aluminum-acetylacetonate, is added into silanol-containing siloxane, DMS-S12 and PDS-1615, in the flask and then the mixture is stirred at the room temperature for about 20 minutes until the catalyst is dissolved. Then, epoxy modified siloxane, ECMS-924, is added into the mixture in the flask and the mixture is stirred for about 20 minutes to produce resin. The produced resin is treated by vacuum de-aeration for about 30 minutes. Then, the resin is introduced into a mold and baked to be hardened in an oven at 120° C. for an hour and then at 150° C. for two hours. The hardened resin is released from the mold so that a transparent silicone epoxy composition of embodiment 2 is obtained.

Embodiment 3

| Components | Weight Percentage |
| --- | --- |
| ECMS-924 | 76.26 wt % |
| DMS-S12 | 22.89 wt % |
| Aluminun-Acetylacetonate | 0.01 wt % |
| TP-10H | 0.74 wt % |

The catalyst, aluminum-acetylacetonate, and additive (antioxidant), TP-10H, are added into silanol-containing siloxane, DMS-S12, in the flask and then the mixture is stirred at the room temperature for about 20 minutes until the catalyst and the additive are dissolved. Then, epoxy modified siloxane, ECMS-924, is added into the mixture in the flask and the mixture is stirred for about 20 minutes to produce resin. The produced resin is treated by vacuum de-aeration for about 30 minutes. Then, the resin is introduced into a mold and baked to be hardened in an oven at 120° C. for an hour and then at 150° C. for two hours. The hardened resin is released from the mold so that a transparent silicone epoxy composition of embodiment 3 is obtained.

Embodiment 4

| Components | Weight Percentage |
| --- | --- |
| ECMS-924 | 73.8 wt % |
| PDS-1615 | 7.66 wt % |
| DMS-S12 | 17.7 wt % |
| Aluminun-Acetylacetonate | 0.1 wt % |
| TP-10H | 0.74 wt % |

The catalyst, aluminum-acetylacetonate, and additive (antioxidant), TP-10H, are added into silanol-containing siloxane, DMS-S12 and PDS-1615, in the flask and then the mixture is stirred at the room temperature for about 20 minutes until the catalyst and the additive are dissolved. Then, epoxy modified siloxane, ECMS-924, is added into the mixture in the flask and the mixture is stirred for about 20 minutes to produce resin. The produced resin is treated by vacuum de-aeration for about 30 minutes. Then, the resin is introduced into a mold and baked to be hardened in an oven at 120° C. for an hour and then at 150° C. for two hours. The hardened resin is released from the mold so that a transparent silicone epoxy composition of embodiment 4 is obtained.

Embodiment 5

| Components | Weight Percentage |
| --- | --- |
| ECMS-924 | 35.72 wt % |
| DMS-S15 | 64.22 wt % |
| Aluminun-Acetylacetonate | 0.06 wt % |

The catalyst, aluminum-acetylacetonate, is added into silanol-containing siloxane, DMS-S15, in the flask and then the mixture is stirred at the room temperature for about 20 minutes until the catalyst is dissolved. Then, epoxy modified siloxane, ECMS-924, is added into the mixture in the flask and the mixture is stirred for about 20 minutes to produce resin. The produced resin is treated by vacuum de-aeration for about 30 minutes. Then, the resin is introduced into a mold and baked to be hardened in an oven at 100° C. for an hour and then at 120° C. for two hours. The hardened resin is released from the mold so that a transparent silicone epoxy composition of embodiment 5 is obtained.

Embodiment 6

| Components | Weight Percentage |
|---|---|
| SEP-151 | 20.68 wt % |
| DMS-S15 | 79.27 wt % |
| Aluminun-Acetylacetonate | 0.05 wt % |

The catalyst, aluminum-acetylacetonate, is added into silanol-containing siloxane, DMS-S15, in the flask and then the mixture is stirred at the room temperature for about 20 minutes until the catalyst is dissolved. Then, epoxy modified siloxane, SEP-151, is added into the mixture in the flask and the mixture is stirred for about 20 minutes to produce resin. The produced resin is treated by vacuum de-aeration for about 30 minutes. Then, the resin is introduced into a mold and baked to be hardened in an oven at 100° C. for an hour and then at 120° C. for two hours. The hardened resin is released from the mold so that a transparent silicone epoxy composition of embodiment 6 is obtained.

Embodiment 7

| Components | Weight Percentage |
|---|---|
| SEP-301 | 15.47 wt % |
| DMS-S15 | 84.48 wt % |
| Aluminun-Acetylacetonate | 0.05 wt % |

The catalyst, aluminum-acetylacetonate, is added into silanol-containing siloxane, DMS-S15, in the flask and then the mixture is stirred at the room temperature for about 20 minutes until the catalyst is dissolved. Then, epoxy modified siloxane, SEP-301, is added into the mixture in the flask and the mixture is stirred for about 20 minutes to produce resin. The produced resin is treated by vacuum de-aeration for about 30 minutes. Then, the resin is introduced into a mold and baked to be hardened in an oven at 100° C. for an hour and then at 120° C. for two hours. The hardened resin is released from the mold so that a transparent silicone epoxy composition of embodiment 7 is obtained.

Embodiment 8

| Components | Weight Percentage |
|---|---|
| ECMS-924 | 34.41 wt % |
| DMS-S15 | 61.93 wt % |
| PDS-1615 | 3.61 wt % |
| Aluminun-Acetylacetonate | 0.05 wt % |

The catalyst, aluminum-acetylacetonate, is added into silanol-containing siloxane, DMS-S15 and PDS-1615, in the flask and then the mixture is stirred at the room temperature for about 20 minutes until the catalyst is dissolved. Then, epoxy modified siloxane, ECMS-924, is added into the mixture in the flask and the mixture is stirred for about 20 minutes to produce resin. The produced resin is treated by vacuum de-aeration for about 30 minutes. Then, the resin is introduced into a mold and baked to be hardened in an oven at 100° C. for an hour and then at 120° C. for two hours. The hardened resin is released from the mold so that a transparent silicone epoxy composition of embodiment 8 is obtained.

Embodiment 9

| Components | Weight Percentage |
|---|---|
| SEP-151 | 24.66 wt % |
| DMS-S15 | 71.18 wt % |
| PDS-1615 | 4.11 wt % |
| Aluminun-Acetylacetonate | 0.05 wt % |

The catalyst, aluminum-acetylacetonate, is added into silanol-containing siloxane, DMS-S15 and PDS-1615, in the flask and then the mixture is stirred at the room temperature for about 20 minutes until the catalyst is dissolved. Then, epoxy modified siloxane, SEP-151, is added into the mixture in the flask and the mixture is stirred for about 20 minutes to produce resin. The produced resin is treated by vacuum de-aeration for about 30 minutes. Then, the resin is introduced into a mold and baked to be hardened in an oven at 100° C. for an hour and then at 120° C. for two hours. The hardened resin is released from the mold so that a transparent silicone epoxy composition of embodiment 9 is obtained.

Embodiment 10

| Components | Weight Percentage |
|---|---|
| SEP-301 | 18.72 wt % |
| DMS-S15 | 76.74 wt % |
| PDS-1615 | 4.49 wt % |
| Aluminun-Acetylacetonate | 0.05 wt % |

The catalyst, aluminum-acetylacetonate, is added into silanol-containing siloxane, DMS-S15 and PDS-1615, in the flask and then the mixture is stirred at the room temperature for about 20 minutes until the catalyst is dissolved. Then, epoxy modified siloxane, SEP-301, is added into the mixture in the flask and the mixture is stirred for about 20 minutes to produce resin. The produced resin is treated by vacuum de-aeration for about 30 minutes. Then, the resin is introduced into a mold and baked to be hardened in an oven at 100° C. for an hour and then at 120° C. for two hours. The hardened resin is released from the mold so that a transparent silicone epoxy composition of embodiment 10 is obtained.

Table 5 shows the physical properties of embodiments 1 (E1), 3 (E3) and 6 (E6) and comparison exemplars 1 (C1), 2 (C2) and 3 (C3) respectively.

TABLE 5

|  | E1 | E3 | E6 | C1 | C2 | C3 |
|---|---|---|---|---|---|---|
| Primary Transparency % | 94 | 94 | 93 | 88 | 90 | <60 |
| LED package workability | ○ | ○ | ○ | ○ | ○ | X |
| Ultraviolet photothermal stability (1000 h) | ◎ | ◎ | ◎ | ○ | — | — |
| heat durability (130° C./1000 h) | ○ | ◎ | ◎ | ◎ | X | — |
| high temperature-moisture stability (85° C./humidity 85%/168 h) | ◎ | ◎ | ◎ | X | — | — |
| adherence | Δ | ○ | ○ | ○ | ○ | ○ |

The comparison exemplar 1 (C1) is commercialized silicone resin and the composition components of the comparison exemplar 2 (C2) include epoxy modified siloxane SEP-500 (62.1 wt %), Methyl hexahydrophthalic anhydride (MHHPA)(37.1 wt %), catalyst U-CAT 5003 (0.2 wt %) and additive (1.5 wt %). Further, the composition components of the comparison exemplar 3 (C3) include commercialized siloxane (60 wt %), silanol (39.95 wt %) and catalyst U-CAT 5003 (0.05 wt %).

Moreover, in the field, "LED package workability", of Table 5, ○ represents good workability, Δ represents acceptable workability and X represents poor workability. Also, the field, "adherence" of Table 5 shows the adherences of the embodiments to the glass and the comparison exemplars to the glass, wherein ○ represents good adherence, Δ represents acceptable adherence and X represents poor adherence.

Furthermore, the field, "Ultraviolet photothermal stability (1000 h)", of Table 5 shows the transparent performance after the embodiments and comparison exemplars are radiated by the ultraviolet for 1000 hours. The field "heat durability (130° C./1000 h)", shows the transparent performance after the embodiments and comparison exemplars are heated at 130° C. for 1000 hours. The field "high temperature-moisture stability (85° C./humidity 85%/168 h)", shows the transparent performance after the embodiments and comparison exemplars are heated at 85° C. in an environment with 85% humidity for 168 hours. In the three aforementioned fields, ◎ represents the transparency decay smaller than 5% after being radiated by light beam with wavelength of about 450 nm, ○ represents the transparency decay about 5~10% after being radiated by light beam with wavelength of about 450 nm and X represents the transparency decay larger than 20% after being radiated by light beam with wavelength of about 450 nm.

The comparison exemplar 1 (C1) is the commercialized silicone resin and it's high temperature-moisture stability shows that the comparison exemplar 1 is not the high temperature-moisture durable material. The comparison exemplar 2 (C2) is the conventional silicone epoxy-anhydride composition. Because of the poor heat durability of the anhydride composition, the transparency of the comparison exemplar 2 is greatly decayed after being heated at 130° C. for 1000 hours. Moreover, the comparison exemplar 3 (C3) is the conventional opaque molding compound so that the primary transparency of the comparison exemplar 3 (C3) is smaller than 60% and the comparison exemplar 3 (C3) is poor on the LED package workability. Apparently, the physical properties of the transparent silicone epoxy composition of the present application (at least including embodiment 1, embodiment 3 and embodiment 6), such as workability, photothermal stability, heat durability and high temperature-moisture stability, are better than those of the comparison exemplars (C1, C2 and C3).

More specifically, since, in the transparent silicone epoxy composition, epoxy modified siloxane and the silanol-containing siloxane contain large amount of siloxane structures, the bonding energy of the transparent silicone epoxy composition increases. Hence, the transparent silicone epoxy composition has the physical properties of good ultraviolet stability, good thermal stability and ability to alleviate stress. Further, since epoxy modified siloxane and the silanol-containing siloxane contain large amount of siloxane structures, the transparency of the transparent silicone epoxy composition increases. Thus, the transparency of the transparent silicone epoxy composition is up to 90% under the radiation of visible light beam with wavelength of about 400~700 nm.

Furthermore, since the molecular link of siloxane is relatively soft, the whole transparent silicone epoxy composition has the physical properties of relatively small stress and ability to alleviate stress. Moreover, by using the hydrosilylation, the cycloaliphatic epoxide groups are introduced into the molecular link of siloxane so that the whole molecular weight can be controlled to be about 1000~15000. Also, since, in epoxy modified siloxane, the m/n ratio is about 1~12, the transparent silicone epoxy composition has proper crosslink density to improve the defects of the conventional silica gel material such as poor air-barrier ability and easy atomized under the environment of high temperature and high humidity. Since the transparent silicone epoxy composition produced by the cross-linking reaction of epoxy modified siloxane with silanol-containing siloxane has polar groups capable of reacting with the interface of the substrate to generate chemical interaction force, the adherence between the transparent silicone epoxy composition and the interface of the substrate is increased.

By using silanol-containing siloxane as the curing agent, the index of refraction of the transparent silicone epoxy composition and the reactivity of silanol-containing siloxane reacting with epoxy modified siloxane can be adjusted by controlling the amount of the non-substituted alkyl groups and phenyl groups on the main link of the siloxane. When the main link of silanol-containing siloxane contains relatively large amount of phenyl groups, the index of refraction of the transparent silicone epoxy composition increases and, meanwhile, the reaction rate of silanol-containing siloxane reacting with epoxy modified siloxane increases. Moreover, by adjusting the ratio of the non-substituted alkyl groups to the phenyl groups on the main link of the siloxane, the reaction temperature can be adjusted to a proper level. Further, comparing with the conventional transparent silicone epoxy system using anhydride as the curing agent, the application uses silanol-containing siloxane as the curing agent, which leads to a relatively low reaction temperature of the reaction of silanol-containing siloxane with epoxy modified siloxane and a better photothermal stability.

Also, in the present application, by using the aluminum complex compound as the catalyst, the risk of failure in curing process due to the poisoning of the platinum catalyst used in the conventional transparent molding compound can be avoided.

Therefore, the transparent silicone epoxy composition of the present application can be applied on the LED package workable material to improve the physical properties of the transparent LED molding compound, such as photothermal stability, moisture/air-barrier ability, adherence and mechanical property.

It will be apparent to those skilled in the art that various modifications and variations can be made to the structure of the present application without departing from the scope or spirit of the application. In view of the foregoing descriptions, it is intended that the present application covers modifications and variations of this application if they fall within the scope of the following claims and their equivalents.

What is claimed is:

1. A transparent silicone epoxy composition, consisting of:
(a) at least an epoxy modified siloxane of formula (1):

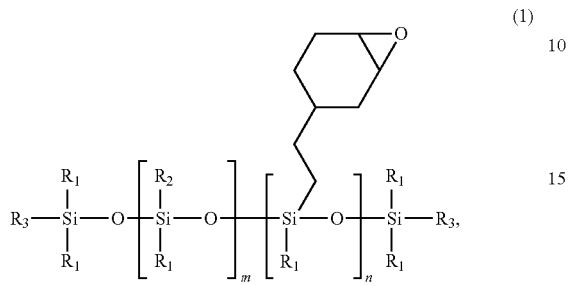

wherein
n is larger than or equal to two, m/n is about 1~12, $R_1$ is non-substituted $C_1$~$C_3$ alkyl, $R_2$ is non-substituted $C_1$~$C_3$ alkyl or phenyl, $R_3$ is non-substituted $C_1$~$C_3$ alkyl or epoxide, each molecule of epoxy modified siloxane at least comprises two cycloaliphatic epoxide groups, the number average molecular weight of epoxy modified siloxane is about 1000~15000, the weight percentage of epoxy modified siloxane in the transparent silicone epoxy composition is about 10~89 wt %;
(b) at least a silanol-containing siloxane of formula (2):

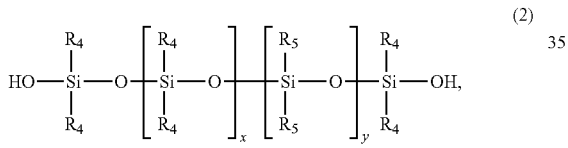

wherein
$5 \leq x \leq 40, 0 \leq y \leq 5$, $R_4$ is non-substituted $C_1$~$C_3$ alkyl, $R_5$ is phenyl, the number average molecular weight of silanol-containing siloxane is about 500~4000, silanol-containing siloxane comprises at least two hydroxyl groups and the weight percentage of silanol-containing siloxane in the transparent silicone epoxy composition is about 89~10 wt %; and
(c) a catalyst, wherein the weight percentage of the catalyst in the transparent silicone epoxy composition is about 0.01~1 wt % and the catalyst is selected from the group consisting of aluminum acetylacetonate, aluminum tris(propylacetonate), quaternary phosphonium bromide promoter or quaternary ammonium salt promoter.

2. The transparent silicone epoxy composition of claim 1, wherein n is about 3~10 and m/n=2~10.

3. The transparent silicone epoxy composition of claim 1, wherein the weight percentage of epoxy modified siloxane in the transparent silicone epoxy composition is about 15~85 wt %.

4. The transparent silicone epoxy composition of claim 1, wherein $7 \leq x \leq 35$ and $0 \leq y \leq 3$.

5. The transparent silicone epoxy composition of claim 1, wherein the weight percentage of silanol-containing siloxane in the transparent silicone epoxy composition is about 85~15 wt %.

6. A transparent silicone epoxy composition, consisting of:
(a) at least an epoxy modified siloxane of formula (1):

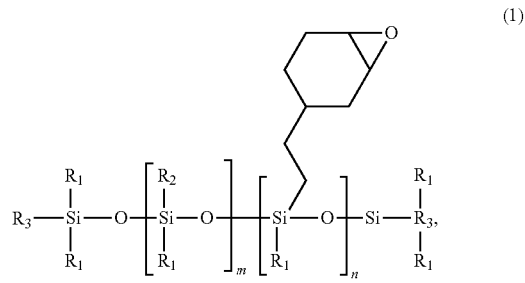

wherein
n is larger than or equal to two, m/n is about 1~12, $R_1$ is non-substituted $C_1$~$C_3$ alkyl, $R_1$ is non-substituted $C_1$~$C_3$ alkyl or phenyl, $R_3$ is non-substituted $C_1$~$C_3$ alkyl or epoxide, each molecule of epoxy modified siloxane at least comprises two cycloaliphatic epoxide groups, the number average molecular weight of epoxy modified siloxane is about 1000~15000, the weight percentage of epoxy modified siloxane in the transparent silicone epoxy composition is about 10~89 wt %;
(b) at least a silanol-containing siloxane of formula (2):

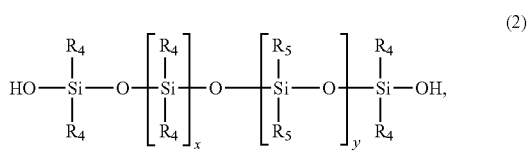

wherein
$5 \leq x \leq 40, 0 \leq y \leq 5$, $R_4$ is non-substituted $C_1$~$C_3$ alkyl, $R_5$ is phenyl, the number average molecular weight of silanol-containing siloxane is about 500~4000, silanol-containing siloxane comprises at least two hydroxyl groups and the weight percentage of silanol-containing siloxane in the transparent silicone epoxy composition is about 89~10 wt %;
(c) a catalyst, wherein the weight percentage of the catalyst in the transparent silicone epoxy composition is about 0.01~1 wt % and the catalyst is selected from the group consisting of aluminum acetylacetonate, aluminum tris(propylacetonate), quaternary phosphonium bromide promoter or quaternary ammonium salt promoter; and
(d) an additive, wherein the additive comprises an anti-thermal oxidation agent, an ultraviolet absorbent or an adhesion promoter.

7. The transparent silicone epoxy composition of claim 6, wherein the weight percentage of the additive in the transparent silicone epoxy composition is about 0.01~1 wt %.

8. The transparent silicone epoxy composition of claim 6, wherein the weight percentage of the additive in the transparent silicone epoxy composition is about 0.05~0.8 wt %.

9. The transparent silicone epoxy composition of claim 6, wherein the anti-thermal oxidation agent comprises hindered phenolic compounds or organophosphite compounds.

* * * * *